United States Patent
Makita et al.

(10) Patent No.: US 9,479,083 B2
(45) Date of Patent: Oct. 25, 2016

(54) POWER CONVERTER IN WHICH SWITCHING ELEMENTS ARE DRIVEN IN PARALLEL

(71) Applicant: FANUC Corporation, Minamitsuru-gun, Yamanashi (JP)

(72) Inventors: Hajime Makita, Minamitsuru-gun (JP); Masato Watanabe, Minamitsuru-gun (JP)

(73) Assignee: FANUC Corporation, Minamitsuru-gun, Yamanashi (JP)

(*) Notice: Subject to any disclaimer, the term of this patent is extended or adjusted under 35 U.S.C. 154(b) by 187 days.

(21) Appl. No.: 13/952,835

(22) Filed: Jul. 29, 2013

(65) Prior Publication Data

US 2014/0029323 A1 Jan. 30, 2014

(30) Foreign Application Priority Data

Jul. 30, 2012 (JP) ................................ 2012-168229

(51) Int. Cl.
| | |
|---|---|
| *H02M 7/493* | (2007.01) |
| *H03K 17/12* | (2006.01) |
| *H03K 17/16* | (2006.01) |
| *H02M 7/538* | (2007.01) |
| *H02M 7/5387* | (2007.01) |

(52) U.S. Cl.
CPC ............ *H02M 7/5387* (2013.01); *H02M 7/493* (2013.01); *H03K 17/127* (2013.01); *H03K 17/168* (2013.01)

(58) Field of Classification Search
CPC . H02M 7/5387; H02M 7/493; H03K 17/127
USPC ........................................................ 363/132
See application file for complete search history.

(56) References Cited

U.S. PATENT DOCUMENTS

| 6,795,324 B2* | 9/2004 | Mori ..................... H02M 7/003 257/691 |
| 2006/0226708 A1* | 10/2006 | Schlapbach et al. ............ 307/98 |

FOREIGN PATENT DOCUMENTS

| JP | H09-261948 A | 10/1997 |
| JP | 2004-187360 A | 7/2004 |
| JP | 4847707 B2 | 12/2011 |
| JP | 2012-039790 A | 2/2012 |
| JP | 2012039790 A * | 2/2012 |
| WO | WO 01/01453 A2 | 1/2001 |

OTHER PUBLICATIONS

Translation for document JP 2012039790 A is attached.*

* cited by examiner

*Primary Examiner* — Jessica Han
*Assistant Examiner* — Bart Iliya
(74) *Attorney, Agent, or Firm* — Drinker Biddle & Reath LLP

(57) ABSTRACT

A power converter for converting DC power to AC power by switching operation of a switching element includes: a bridge circuit configured by at least two series circuits using, as power input terminals, terminals on both sides of two switching elements connected to each other in series and using, as a power output terminal, a connection point of the two switching elements are connected in parallel via the power output terminal; a gate drive circuit for outputting a driving signal which controls to turn on/off the switching elements; and signal lines using a driving signal output terminal in the gate drive circuit as a starting point of wiring, individually hard-wired to each of the switching elements in each of series circuits to which the same driving signal is supplied from the driving signal output terminal, and having inductances which are configured equal to each other.

4 Claims, 5 Drawing Sheets

POWER CONVERTER IN WHICH SWITCHING ELEMENTS ARE DRIVEN IN PARALLEL

RELATED APPLICATION DATA

This application claims priority under 35 U.S.C. §119 and/or §365 to Japanese Application No. 2012-168229 filed Jul. 30, 2012, the entire contents is incorporated herein by reference.

BACKGROUND OF THE INVENTION

1. Field of the Invention

The present invention relates to a power converter which converts an input DC power to an AC power by a switching operation of switching elements and outputs the AC power and, more particularly, to a power converter in which series circuits each having two switching elements connected in series are connected in parallel and driven in parallel.

2. Description of Related Art

In a motor driving apparatus for driving a motor in machine tools, a forge rolling machine, an injection machine, an industrial machine, or various robots, as a power converter for converting an input DC power to AC power for driving a three-phase AC motor, a three-phase inverter circuit is generally used.

FIG. 4 is a circuit diagram illustrating a three-phase inverter circuit used for a motor driving apparatus. Hereinafter, the u-phase will be mainly described but the v-phase and the w-phase are similar. In a motor driving apparatus, a DC voltage is applied to the terminals P and N on the DC input side of an inverter circuit 101, and the alternating currents $i_u$, $i_v$, and $i_w$ of three phases for driving the three-phase AC motor are output. The inverter circuit 101 is configured as a full-bridge inverter having switching elements $Su_T$, $Sv_T$, and $Sw_T$ provided at an upper arm and switching elements $Su_B$, $Sv_B$, and $Sw_B$ provided at a lower arm with a reflux diode D connected in antiparallel for each of the switching elements. Concretely, a series circuit is configured by the switching elements $Su_T$ and $Su_B$ for the u phase, a series circuit is configured by the switching elements $Sv_T$ and $Sv_B$ for the v phase, and a series circuit is configured by the switching elements $Sw_T$ and $Sw_B$ for the w phase. An example of the switching element is an IGBT. In the inverter circuit 101, each of the series circuits is connected in parallel, the terminals on both sides of each series circuit function as power input terminals, and a connection point of the two switching elements in each series circuit functions as a power output terminal. A driving signal from a gate drive circuit 51 is input to the gate of each of the switching elements, and the on/off control of each of the switching elements is performed by the driving signal. Thereby, the input DC power is converted to a desired frequency for driving the three-phase AC motor and alternating current of a desired voltage. Moreover, in FIG. 4, the signal lines connected from the gate drive circuit 51 to the emitter terminals of each of the switching elements are not illustrated. Although not illustrated, generally, on the DC input side of the inverter circuit 101, a converter (rectifier) for converting an alternating current supplied from a commercial AC power supply to a direct current is often provided.

In the inverter circuit 101, the three-phase alternating currents $i_u$, $i_v$, and $i_w$ which are output are determined by the performance of the switching elements $Su_T$, $Sv_T$, $Sw_T$, $Su_B$, $Sv_B$, and $Sw_B$. The inverter circuit has to output a larger amount of the three-phase alternating currents in order to drive a three-phase AC motor of a higher output, which is realized by an inverter circuit in which at least two series circuits are connected in parallel for each of the phases, as described in Japanese Unexamined Patent Application Publication No. 2012-039790 and Japanese Patent No 4,847,707.

FIG. 5 is a circuit diagram illustrating a three-phase inverter circuit having switching elements connected in parallel. An inverter circuit 102 is configured by connecting at least two series circuits in parallel via a power output terminal. Each of the series circuits uses terminals on both sides of two switching elements connected to each other in series as power input terminals, and uses a connection point of the two switching elements as the power output terminal. In the example illustrated in FIG. 5, two series circuits are connected in parallel per phase. The larger the number of parallel connections is, the larger an AC output from the inverter circuit becomes.

In the example illustrated in FIG. 5, for example, in the u-phase, a series circuit u-1 made by switching elements $Su1_T$ and $Su1_B$ and a series circuit u-2 made by switching elements $Su2_T$ and $Su2_B$ are connected to each other via a power output terminal as a connection point of the two switching elements in each of the series circuits, thereby constructing a parallel connection of the series circuits u-1 and u-2. The configuration with respect to each of the v-phase and the w-phase is similar to the above, but its description will not be repeated. In such an inverter circuit 102, when the same driving signal is supplied from the gate drive circuit 51 to gate terminals of the switching elements at the same arm in each of the phases, a parallel driving is performed. For example, in the u-phase, the driving signal supplied from the gate drive circuit 51 to the gate terminal of the switching element $Su1_T$ at the upper arm of the series circuit u-1 is the same as the one supplied to the gate terminal of the switching element $Su2_T$ at the upper arm of the series circuit u-2. The configuration at the lower arm is similar to the above, and the same driving signal is supplied from the gate drive circuit 51 to each of the gate terminals of the switching elements $Su1_B$ and $Su2_B$. Also in the v-phase and the w-phase, the driving signal is supplied in a similar manner. To supply the same driving signal as described above, a signal line from the gate drive circuit 51 is formed by the same wiring up to near a gate terminal of a switching element and branched from near the gate terminal, and the branched lines are connected to each of the gate terminals respectively. In FIG. 5, however, the signal lines connected from the gate drive circuit 51 to emitter terminals of each of the switching elements are not illustrated.

As described above, in the inverter circuit to which the series circuits formed by two switching elements are connected in parallel, the switching elements to which the same driving signal is supplied from the gate drive circuit are to ideally perform a switching operation at the same timing. In an actual operation, however, due to a dispersion of the characteristics of the components such as the switching elements, and a dispersion of the wiring inductances of a main circuit, or the like, a time lag occurs in the timings of the switching operations of the switching elements. Due to the time lag in the timings of the switching operations of the switching elements, a bias in a current assignment or oscillating voltage occurs, an influence is exerted from the main circuit to the gate drive circuit, an influence is exerted from the gate drive circuit to a control circuit and, finally, an erroneous operation in the switching element is caused.

FIG. 6 is a diagram for explaining a voltage oscillation caused by the time lag in switching operations of switching elements in a three-phase inverter circuit having switching elements connected in parallel. To simplify the explanation, the switching elements $Su1_B$ and $Su2_B$ at the lower arm of the u-phase will be described. Although the signal lines connected from the gate drive circuit 51 to the emitter terminals of each of the switching elements are omitted in FIGS. 4 and 5, the signal lines Eu are also illustrated in FIG. 6.

As illustrated in FIG. 6, the lower arm of the u-phase has a configuration that the switching elements $Su1_B$ and $Su2_B$ are connected in parallel, and the same driving signal is supplied from the gate drive circuit 51 via a signal line Gu to the gate terminals of the switching elements $Su1_B$ and $Su2_B$. As described above, the signal line Gu from the gate drive circuit 51 is branched near the gate terminals of the switching elements to which the same driving signal is supplied, and the branched signal lines are connected to each of the gate terminals. The signal line Eu connected from the gate drive circuit 51 to each of the emitter terminals is similarly branched near the emitter terminals of the switching elements to which the same driving signal is supplied. By employing such a branch structure, the line length between the gate terminals and that of the emitter terminals of the switching elements $Su1_B$ and $Su2_B$ connected in parallel is shortened. Consequently, the terminals are connected at a low inductance, a loop of a current path is formed between the terminals and the main circuit wiring M, and the influence of the voltage oscillation is easily exerted. Concretely, as illustrated in FIG. 6, the emitter terminals of the switching elements $Su1_B$ and $Su2_B$ are connected at low impedance as described above. Therefore, a loop A as indicated by a dotted line in the diagram is formed by the signal line Eu and the main circuit wiring M, the voltage oscillation occurs, noise current flows, and the switching elements and the gate drive circuit are influenced. Generally, a capacitor C is connected between the gate terminal and the emitter terminal of each of the switching elements $Su1_B$ and $Su2_B$. Consequently, a loop B as indicated by an alternate long and short dash line in the diagram is formed by the signal lines Gu and Eu and the main circuit wiring M. The voltage oscillation occurs, noise current flows, and the switching elements and the gate drive circuit are influenced. Since such a voltage oscillation occurs in the switching operation of the switching elements at the upper arm or the lower arm, consequently, for example, due to the noise current caused by the voltage oscillation which occurs when the switching elements $Su1_B$ and $Su2_B$ at the lower arm are turned on, the switching elements $Su1_T$ and $Su2_T$ (not illustrated in FIG. 6) at the upper arm of the same u-phase perform an erroneous operation, an unexpected short-circuit occurs, and as a result the switching elements become broken.

As described above, due to the time lag in the timings of the switching operations of the switching elements caused by a dispersion of the characteristics of the components, a dispersion of the wiring inductance of the main circuit, or the like, a bias in a current assignment or oscillating voltage occurs, and an erroneous operation and breakage of the switching elements of the same phase is caused. To prevent this, an inverter circuit to which series circuits, made by two switching elements, are connected in parallel generally employs a measure of suppressing a bias in a current assignment among the switching elements by suppressing a dispersion in the characteristics of the components and a dispersion in the inductance of the main circuit wiring, a measure of suppressing a voltage oscillation among the switching elements by a symmetrization of the main circuit such as an equalization of inductance, an orthogonalization between the wiring of the gate driving signal and the main circuit wiring, or an equalization of inductance values by shortening the wiring of the gate driving signal, or the like.

It is, however, very difficult to suppress a dispersion in the characteristics of the components, and it is not a realistic measure when cost and labor are considered.

Moreover, when it is attempted to perform a wiring in a main circuit uniformly, the flexibility and degree of freedom of designing are largely regulated, and an inverter circuit tends to become large and, as a result, a motor driving apparatus including the inverter circuit also becomes large. There is consequently a problem that a reduction in space in machine tools, a forge rolling machine, an injection machine, an industrial machine, or various robots each including such a motor driving apparatus may occur.

Further, although a measure to shorten the wired length of signal lines to the gate terminals to make the inductances uniform is a relatively realistic, it is insufficient.

Further, since an inverter circuit is designed in a limited mounting area in practice, it is very difficult to carry out all the measures that are described above.

SUMMARY OF THE INVENTION

In view of the above-described problems, an object of the present invention is to provide a power converter in which series circuits having two switching elements connected in series are connected in parallel and driven in parallel, by which an erroneous operation and breakage of the switching elements caused by the occurrence of voltage oscillation in main circuit wirings and signal lines can be prevented.

To realize the object, a power converter for converting input DC power to AC power by switching operation of a switching element includes: a bridge circuit configured by at least two series circuits using, as power input terminals, terminals on both sides of two switching elements connected to each other in series and using, as a power output terminal, a connection point of the two switching elements are connected in parallel via the power output terminal; a gate drive circuit for outputting a driving signal which controls to turn on/off the switching elements; and signal lines using a driving signal output terminal in the gate drive circuit as a starting point of wiring, individually hard-wired to each of the switching elements which are turned on/off by the same driving signal, and having inductances which are substantially equal to each other.

The signal lines include: gate signal lines individually hard-wiring a positive-side electrode in the driving signal output terminal and each of gate terminals of the switching elements in each of the series circuits to which the same driving signal is supplied from the driving signal output terminal; and emitter signal lines individually hard-wiring a negative-side electrode in the driving signal output terminal and emitter terminals of the switching elements in each of the series circuits to which the same driving signal is supplied from the driving signal output terminal.

Inductors are provided on signal lines for transmitting the same driving signal so that inductances of the signal lines is substantially equal to each other.

The signal lines for transmitting the same driving signal have substantially equal impedances.

The signal line is formed by a cable or a wiring pattern provided on a printed board.

BRIEF DESCRIPTION OF DRAWINGS

The present invention will be more clearly understood by referring to the following accompanying drawings.

DETAILED DESCRIPTION

Figure 1:
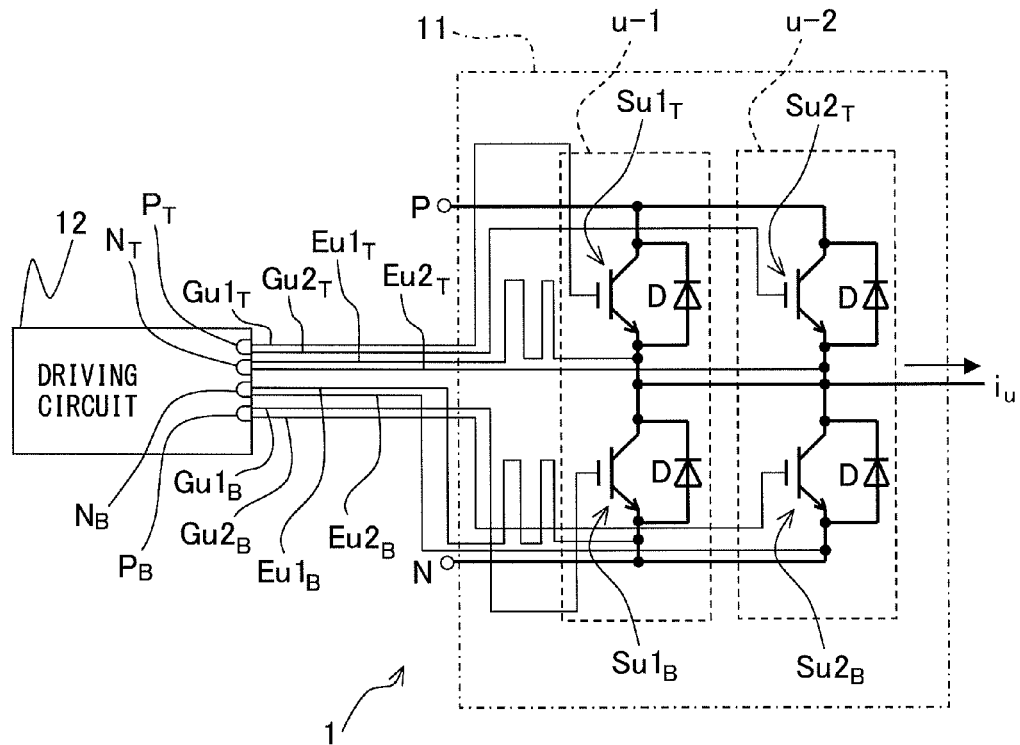
FIG. 1 is a circuit diagram illustrating a power converter according to an embodiment.

Hereinafter, with reference to the drawings, a power converter in which switching elements are connected in parallel and driven in parallel will be described. It is to be understood, however, that the present invention is not limited to the drawings and embodiments to be described below. Hereinafter, a power converter of three phases according to the embodiment, u-phase being focused out of the three phases, will be described. Since the v-phase and w-phase are configured like the u-phase, the v-phase and the w-phase will not be described. FIG. 1 is a circuit diagram illustrating a power converter according to the embodiment. Hereinafter, the components, to which the same reference numerals are given for different drawings, are meant to have the same function.

A power converter 1 is a three-phase inverter circuit which converts an input DC power to an AC power by a switching operation of a switching element. For example, by assembling the power converter 1 in a motor driving apparatus, an AC power output from the power converter 1 can be used to drive a motor, for example, in machine tools, a forge rolling machine, an injection machine, an industrial machine, or various robots. Although not illustrated, a converter for converting an alternating current input from a commercial AC power supply to a direct current and for outputting the direct current may be provided on the DC input side of the power converter 1.

The power converter 1 has a bridge circuit 11, a gate drive circuit 12, and a signal line connecting the circuits.

The bridge circuit 11 is configured by at least two series circuits connected in parallel via a power output terminal and such series circuits deploy terminals connected to each other in series on both sides of the two switching elements as the power input terminals and deploy a connection point of the two switching elements as the power output terminals. Although two series circuits are connected in parallel as an example, two or more series circuits may be connected in parallel. An example of the switching element is an IGBT.

The u-phase will be described in detail. As illustrated in FIG. 1, a series circuit u-1 is configured by connecting, in series, a switching element $Su1_T$ with which a reflux diode D is connected in antiparallel and a switching element $Su1_B$ with which a reflux diode D is connected in antiparallel. The terminals on both sides of the two switching elements $Su1_T$ and $Su1_B$ connected in series are deployed as power input terminals, and a connection point is deployed as a power output terminal. Similarly, a series circuit u-2 is configured by connecting, in series, a switching element $Su2_T$ with which a reflux diode D is connected in antiparallel and a switching element $Su2_B$ with which a reflux diode D is connected in antiparallel. The terminals on both sides of the two switching elements $Su2_T$ and $Su2_B$ connected in series are deployed as power input terminals, and a connection point is deployed as a power output terminal. The series circuits u-1 and u-2 are connected in parallel by connecting respective power output terminal.

The gate drive circuit 12 outputs a driving signal which controls the on-off state of the switching elements. Although the driving signal generating method itself does not limit the present invention, there is a pulse width modulation (PWM) method, for example. In the PWM method, a voltage instruction and a PWM carrier wave are compared. In the case where the voltage instruction is larger than the PWM carrier wave, a driving signal instructing a turn-on is output to the switching elements $Su1_T$ and $Su2_T$ at the upper arm, and a driving signal instructing a turn-off is output to the switching elements $Su1_B$ and $Su2_B$ at the lower arm, for example. In the case where the voltage instruction is smaller than the PWM carrier wave, a driving signal instructing a turn-off is output to the switching elements $Su1_T$ and $Su2_T$ at the upper arm, and a driving signal instructing a turn-on is output to the switching elements $Su1_B$ and $Su2_B$ at the lower arm. The operation is similarly performed also in the v-phase and the w-phase.

Each of the switching elements in the bridge circuit 11 and the gate drive circuit 12 are connected to each other via signal lines, so that the same driving signal is supplied to the switching elements $Su1_T$ and $Su2_T$ at the upper arm of the series circuits u-1 and u-2 which are connected in parallel, and the same driving signal is supplied to the switching elements $Su1_B$ and $Su2_B$ at the lower arm. In the present invention, using a driving signal output terminal of the gate drive circuit 12 as a starting point, signal lines are individually hard-wired to the switching elements in each series circuit to which the same driving signal is supplied from the driving signal output terminal. It is assumed that each of the signal lines for transferring the same driving signal have substantially equal inductances. It is sufficient to set the inductances of each of the signal lines so as to be equal within a predetermined error range.

The signal lines include a gate signal line and an emitter signal line. The gate signal line is to individually hard-wire a positive-side electrode of the driving signal output terminal and each of the gate terminals of the switching elements in each series circuit to which the same driving signal is supplied from the driving signal output terminal. Moreover, the emitter signal line is to individually hard-wire a negative-side electrode of the driving signal output terminal and each of the emitter terminals of the switching elements in each series circuit to which the same driving signal is supplied from the driving signal output terminal. The signal lines will be concretely described as follows with reference to FIG. 1.

As illustrated in FIG. 1, the same driving signal is supplied to the switching elements $Su1_T$ and $Su2_T$ at the upper arm of the series circuits u-1 and u-2 connected to each other in parallel. Therefore, a positive-side electrode $P_T$ of the driving signal output terminal of the gate drive circuit 12 and the gate terminal of the switching element $Su1_T$ at the upper arm in the series circuit u-1 are hard-wired via a gate signal line $Gu1_T$, and the positive-side electrode $P_T$ of the driving signal output terminal of the gate drive circuit 12 and the gate terminal of the switching element $Su2_T$ at the upper arm in the series circuit u-2 to which the same driving signal as is supplied to the switching element $Su1_T$ are hard-wired via a gate signal line $Gu2_T$. Although the gate signal lines $Gu1_T$ and $Gu2_T$ are provided separately as described above, the gate signal lines $Gu1_T$ and $Gu2_T$ are set so as to have substantially equal inductance.

Since the same driving signal is supplied to the switching elements $Su1_T$ and $Su2_T$, a negative-side electrode $N_T$ of the driving signal output terminal of the gate drive circuit 12 and the emitter terminal of the switching element $Su1_T$ at the upper arm in the series circuit u-1 are hard-wired via an emitter signal line $Eu1_T$, and the negative-side electrode $N_T$ of the driving signal output terminal of the gate drive circuit 12 and the emitter terminal of the switching element $Su2_T$ at the upper arm in the series circuit u-2 to which the same driving signal as is supplied to the switching element $Su1_T$ are hard-wired via an emitter signal line $Eu2_T$. Although the emitter signal lines $Eu1_T$ and $Eu2_T$ are provided separately as described above, the emitter signal lines $Eu1_T$ and $Eu2_T$ are set so as to have substantially equal inductance.

Similarly, the same driving signal is supplied to the switching elements $Su1_B$ and $Su2_B$ at the lower arm of the series circuits u-1 and u-2 connected to each other in parallel. Therefore, a positive-side electrode $P_B$ of the driving signal output terminal of the gate drive circuit 12 and the gate terminal of the switching element $Su1_B$ at the lower arm in the series circuit u-1 are hard-wired via a gate signal line $Gu1_B$, and the positive-side electrode $P_B$ of the driving signal output terminal of the gate drive circuit 12 and the gate terminal of the switching element $Su2_B$ at the lower arm in the series circuit u-2 to which the same driving signal as is supplied to the switching element $Su1_B$ are hard-wired via a gate signal line $Gu2_B$. Although the gate signal lines $Gu1_B$ and $Gu2_B$ are provided separately as described above, the gate signal lines $Gu1_B$ and $Gu2_B$ are set so as to have substantially equal inductance.

Moreover, since the same driving signal is supplied to the switching elements $Su1_B$ and $Su2_B$, a negative-side electrode $N_B$ of the driving signal output terminal of the gate drive circuit 12 and the emitter terminal of the switching element $Su1_B$ at the lower arm in the series circuit u-1 are hard-wired via an emitter signal line $Eu1_B$, and the negative-side electrode $N_B$ of the driving signal output terminal of the gate drive circuit 12 and the emitter terminal of the switching element $Su2_B$ at the lower arm in the series circuit u-2 to which the same driving signal as is supplied to the switching element $Su1_B$ are hard-wired via an emitter signal line $Eu2_B$. Although the emitter signal lines $Eu1_B$ and $Eu2_B$ are provided separately as described above, the emitter signal lines $Eu1_B$ and $Eu2_B$ are set so as to have substantially equal inductance.

Moreover, in the example illustrated in FIG. 1, the gate signal lines $Gu1_T$ and $Gu2_T$, the emitter signal lines $Eu1_T$ and $Eu2_T$, the gate signal lines $Gu1_B$ and $Gu2_B$, and the emitter signal lines $Eu1_B$ and $Eu2_B$ are respectively set so that the wired length and cross-sectional areas of wiring become physically, or lengthwise, the same and, accordingly, the inductances and impedances become substantially equal. It is sufficient to set the inductances and impedances of the signal lines so as to be equal within a predetermined error range.

Figure 2:
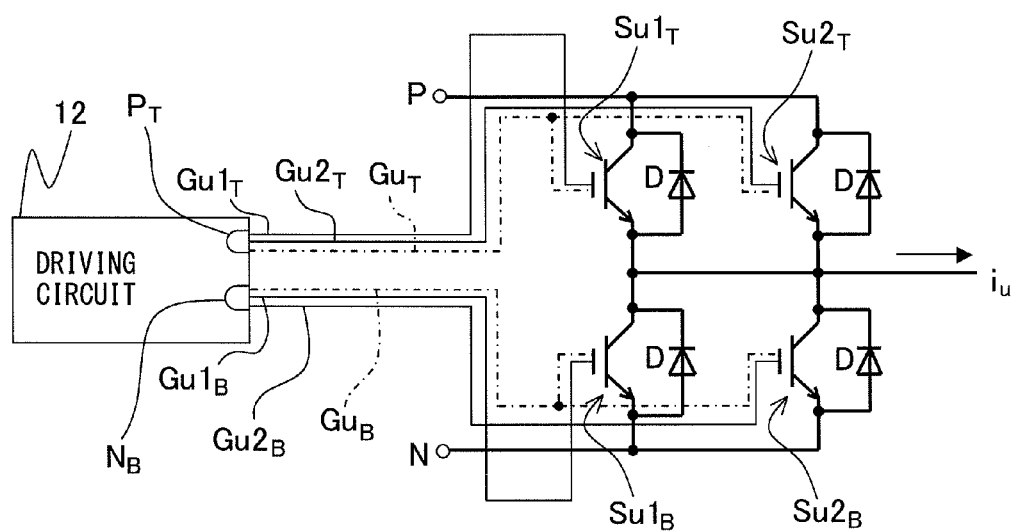
FIG. 2 is a circuit diagram for explaining a comparison between the power converter according to the embodiment and a conventional power converter.

FIG. 2 is a circuit diagram for explaining a comparison between the power converter of the embodiment and a conventional power converter. In FIG. 2, only the u-phase is illustrated, and the signal lines connected from the gate drive circuit 12 to the emitter terminals of each of the switching elements are omitted.

In the conventional technique, to supply the same driving signal, the signal line from the gate drive circuit 12 is formed by the same signal line up to near the gate terminals of switching elements and is branched from near the gate terminals. The branched signal lines are connected to each of the gate terminals respectively. Specifically, as illustrated in FIG. 2, in the conventional technique, a signal line $Gu_T$ (indicated by an alternate long and short dash line in the diagram) connected to the gate terminals of the switching elements $Su1_T$ and $Su2_T$ at the upper arm to which the same driving signal is supplied is formed as the same wiring from the positive-side electrode $P_T$ of the gate drive circuit 12 up to near the gate terminals of the switching elements and the signal line $Gu_T$ is branched from near the gate terminals. The branched signal lines are connected to the gate terminals of the switching elements $Su1_T$ and $Su2_T$. Therefore, in the conventional technique, the length of the wired line between the gate terminals of each of the switching elements $Su1_T$ and $Su2_T$ becomes consequently short, which causes the occurrence of a voltage oscillation as described above and a breakage of the switching elements accompanying the voltage oscillation.

In contrast, according to the present invention, the signal lines from the gate drive circuit 12 are formed separately by the gate signal line $Gu1_T$ hard-wiring the positive-side electrode $P_T$ of the driving signal output terminal of the gate drive circuit 12 and the gate terminal of the switching element $Su1_T$ at the upper arm, and the gate signal line $Gu2_T$ hard-wiring the positive-side electrode $P_T$ of the driving signal output terminal of the gate drive circuit 12 and the gate terminal of the switching element $Su2_T$ at the upper arm. Moreover, the gate signal lines $Gu1_T$ and $Gu2_T$ are set to have an equal length. In other words, the gate signal lines are independently wired respectively up to the gate terminals of the switching elements $Su1_T$ and $Su2_T$, in which the driving signal output terminal of the gate drive circuit 12 is a so-called branch base point of the gate signal lines. Each of the gate signal lines are set to have an equal length so that the inductances from the gate drive circuit 12 to the gate terminals of each of the switching elements $Su1_T$ and $Su2_T$ are the same. Although not illustrated in FIG. 2, the emitter signal lines are similarly wired. Thereby, an inductance component can be provided between the gate terminal and the emitter terminal in each of the switching elements $Su1_T$ and $Su2_T$, which can tend to impede a circulating current flow, while the circulating current uses the signal lines and a main circuit line as a path. Therefore, even in the case where a voltage oscillation occurs, the circulating current does not flow easily, so that the mutual influence between the switching elements and the influence on the gate drive circuit can be suppressed, and an erroneous operation of the switching elements can be prevented.

Next, the equal length of signal lines will be described. Deploying a driving signal output terminal of the gate drive circuit 12 as a starting point, the signal lines are individually hard-wired to every switching element in each series circuit to which the same driving signal is supplied from the driving signal output terminal. The signal lines hard-wired individually are set to have an equal length. The equal length may be realized by using as a member for forming a signal line, for example, a wiring material such as a resistance value and an inductance whose physical characteristics are uniform is used, and the members are set to have the same cross-sectional area and the same length. In the case where a wiring having the same length is not deployed in relation to the arrangement of components, the equal length may be realized by properly adjusting the cross-sectional area of a wiring material. Particularly, in the case of realizing a signal line as a wiring pattern on a printed board, generally, by using a pattern design tool (wiring design software program), a design desired by the user such as the length, width, and thickness of a pattern can be realized, so that the equal lengths of the signal lines can be easily realized with precision. In the case of realizing a signal line by using a cable, for example, by using a cable whose specifications are disclosed, in a manner similar to the above-described case of realizing a signal line by a wiring pattern, the equal length of signal lines can be easily realized with precision.

Figure 3:
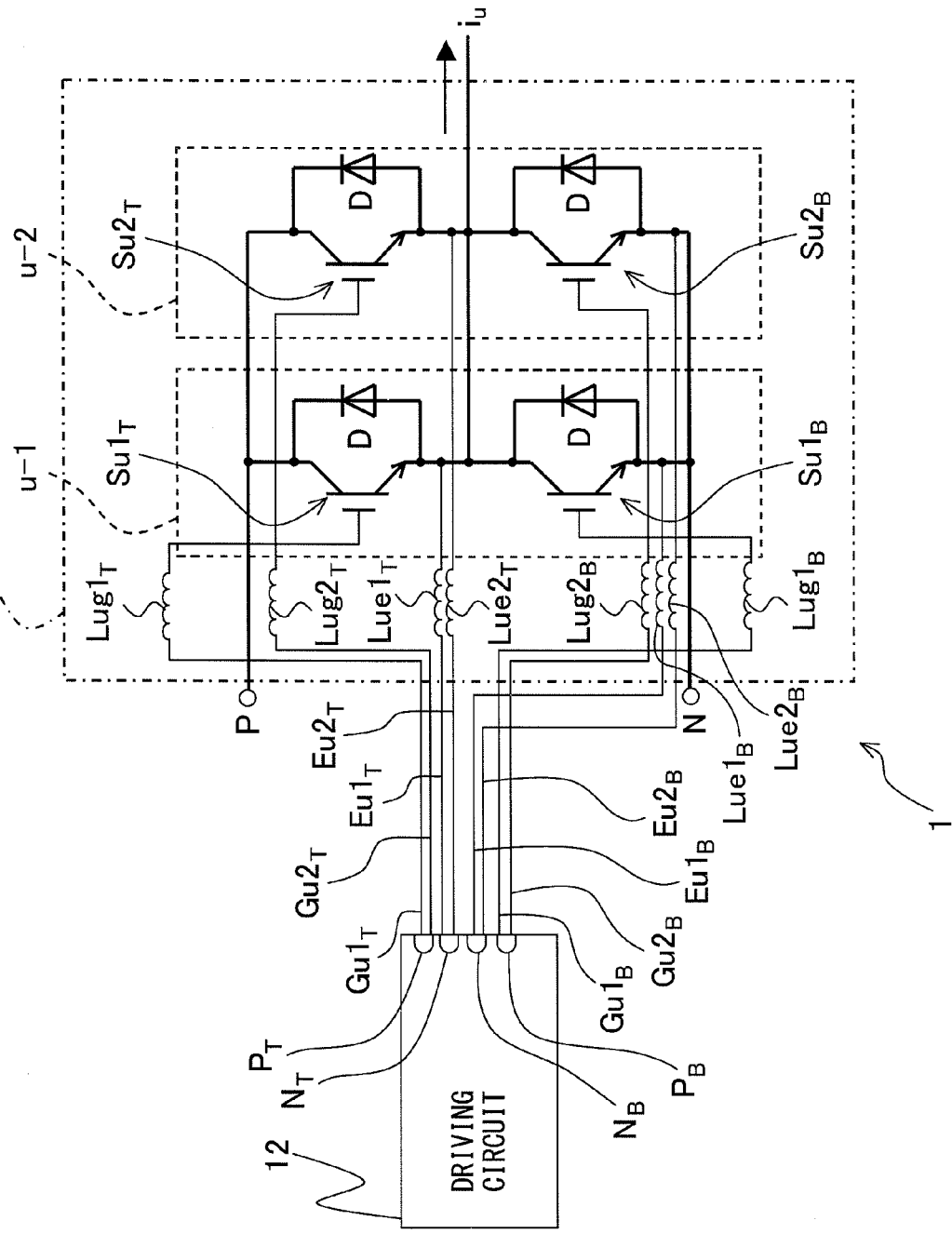
FIG. 3 is a circuit diagram illustrating a modification of the power converter according to the embodiment.
Figure 4:
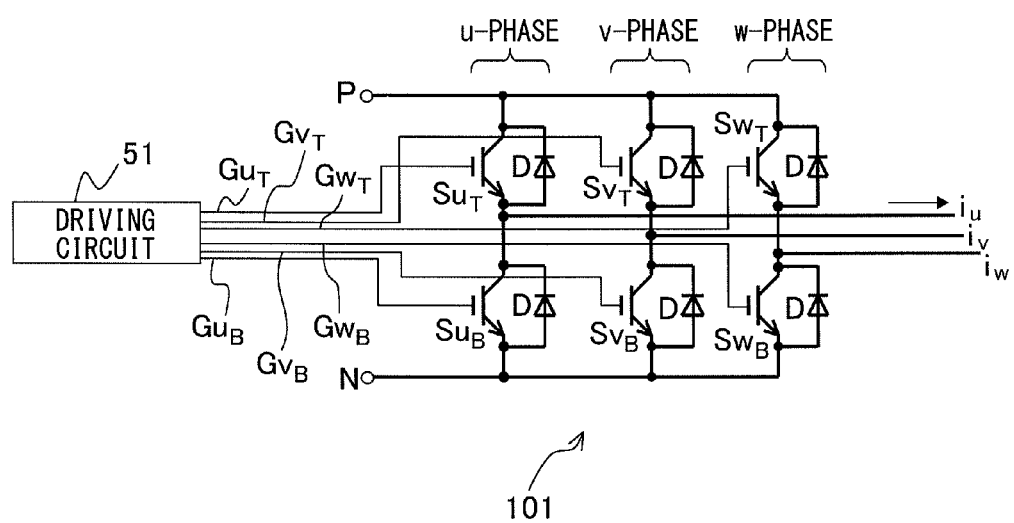
FIG. 4 is a circuit diagram illustrating a three-phase inverter circuit for use in a motor driving apparatus.
Figure 5:
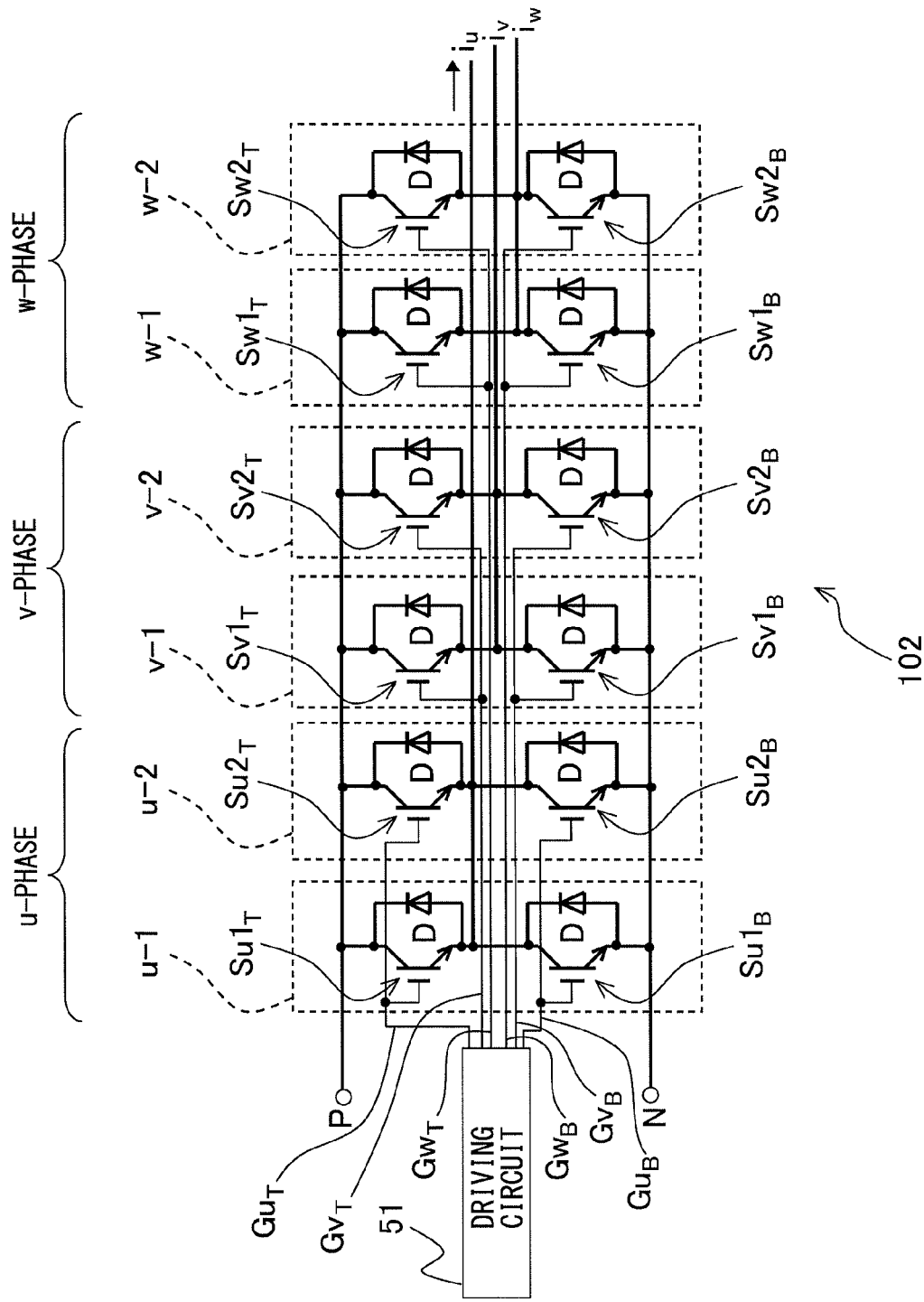
FIG. 5 is a circuit diagram illustrating a three-phase inverter circuit having switching elements connected in parallel.
Figure 6:
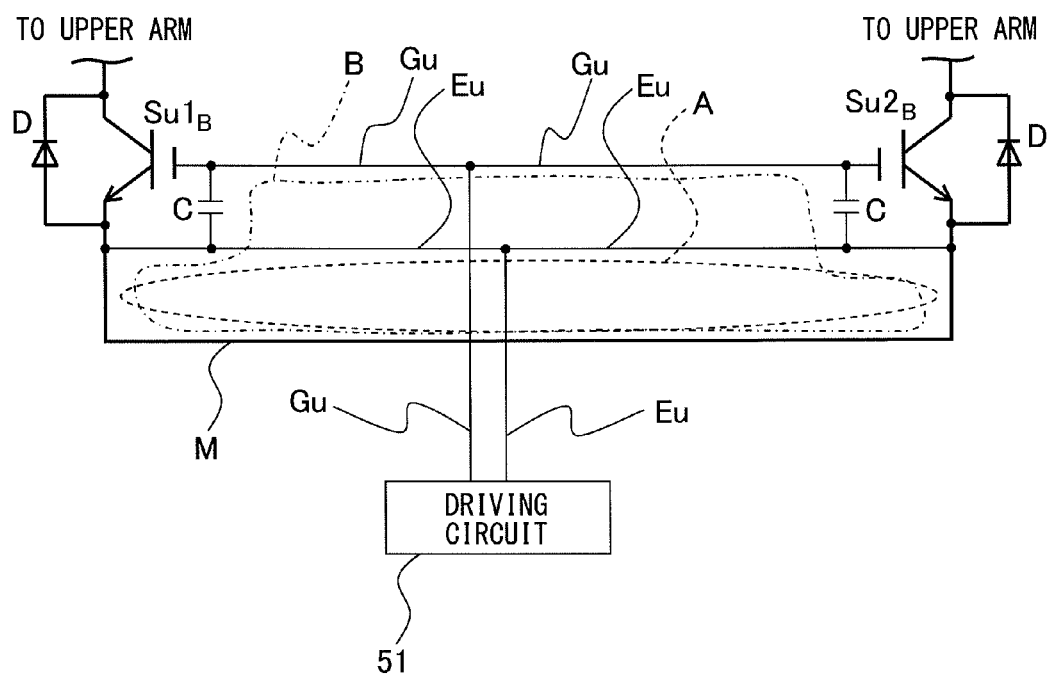
FIG. 6 is a diagram for explaining a voltage oscillation which is caused by a lag in switching operations of switching elements in a three-phase inverter circuit having switching elements connected in parallel.

Moreover, for example, in the case where the wired length and cross-sectional area are not to be adjusted in relation to the arrangement of components, by providing an inductor at some midpoint in the signal lines, signal lines for transmitting the same driving signal may be set to have substantially equal inductances. FIG. 3 is a circuit diagram illustrating a modification of the power converter of the embodiment. In the example illustrated in FIG. 1 described above, the gate signal lines $Gu1_T$ and $Gu2_T$, the emitter signal lines $Eu1_T$ and $Eu2_T$, the gate signal lines $Gu1_B$ and $Gu2_B$, and the emitter signal lines $Eu1_B$ and $Eu2_B$ are set respectively so that the length and cross-sectional areas become physically the same and, accordingly, the inductances and impedances become substantially equal. In the example illustrated in FIG. 3 to be described, however, by providing an inductance at some midpoint in a signal line, the signal lines transmitting the same driving signal have substantially equal inductances. Concretely, as illustrated in FIG. 3, at the upper arm, an inductor $Lug1_T$ is provided at some midpoint in the gate signal line $Gu1_T$ and an inductor $Lug2_T$ is provided at some midpoint in the gate signal line $Gu2_T$, so that the inductance and impedance of the gate signal line $Gu1_T$ and $Gu2_T$ become substantially equal. An inductor $Lue1_T$ is provided at some midpoint in the emitter signal line $Eu1_T$ and an inductor $Lue2_T$ is provided at some midpoint in the emitter signal line $Eu2_T$, so that the inductance and impedance of the emitter signal line $Eu1_T$ and $Eu2_T$ become substantially equal. Similarly, at the lower arm, an inductor $Lug1_B$ is provided at some midpoint in the gate signal line $Gu1_B$ and an inductor $Lug2_B$ is provided at some midpoint in the gate signal line $Gu2_B$, so that the inductance and impedance of the gate signal line $Gu1_B$ and $Gu2_B$ become substantially equal. An inductor $Lue1_B$ is provided at some midpoint in the emitter signal line $Eu1_B$ and an inductor $Lue2_B$ is provided at some midpoint in the emitter signal line $Eu2_B$, so that the inductance and impedance of the emitter signal line $Eu1_B$ and $Eu2_B$ become substantially equal. Since other circuit components are similar to those illustrated in FIG. 1, the same reference numerals are given to the same circuit components and the detailed description of the circuit components will not be repeated.

Moreover, for example, by properly using members of different characteristics as wiring materials of signal lines, the signal lines transmitting the same driving signal may be set to have substantially equal inductances.

The present invention is an inverter circuit (power converter) which converts an input DC power to an AC power by a switching operation of a switching element to be output, which can be applied to an inverter circuit configured by at least two series circuits made by two switching elements connected to each other in series, which series circuits are connected in parallel. In a motor driving apparatus for driving a motor in machine tools, a forge rolling machine, an injection machine, an industrial machine, or various robots, a three-phase inverter circuit is generally deployed as a power converter for converting an input DC power to an AC power for driving a three-phase AC motor. By using the power converter of the present invention, a motor of a high output can be driven, and a motor driving apparatus with high reliability can be realized.

According to the present invention, in the power converter in which series circuits having two switching elements connected in series are connected in parallel and driven in parallel, erroneous operation and breakage of the switching elements caused by occurrence of voltage oscillation in main circuit wirings and signal lines can be suppressed.

Moreover, signal lines hard-wiring each of switching elements in a bridge circuit in which at least two series circuits each configured by two switching elements connected to each other in series are connected in parallel and a gate drive circuit for outputting a driving signal which controls to turn on/off each of the switching elements are realized as signal lines using a driving signal output terminal in the gate drive circuit as a starting point, individually hard-wired to each of the switching elements in each of the series circuits to which the same driving signal is supplied from driving signal output terminal, and having inductances which are substantially equal to each other. Consequently, an inductance component can be provided in the wiring between the gate terminal and the emitter terminal via the driving signal output terminal of the gate drive circuit in each of the switching elements of the same phase, and it can serve to impede a flow of a circulating current in the signal lines and a main circuit line as a path. Therefore, even in the case where a voltage oscillation occurs, the circulating current does not flow easily, so that a mutual influence between the switching elements and the influence on the gate drive circuit can be suppressed, an erroneous operation of the switching elements can be prevented, and reliability of the operation of the power converter improves. Moreover, even if there are a dispersion in the characteristics of each of the components and a dispersion in wiring inductances in the main circuit, by the inductance provided in the wiring between the gate terminal and the emitter terminal of the switching element, the influence of the voltage oscillation exerted on the gate drive circuit can be suppressed. Therefore, an erroneous operation of the switching elements can be prevented, and the reliability of the operation of the power converter improves. Moreover, since symmetry of the main circuit wiring can be reduced as compared with the conventional technique, flexibility and the degree of freedom of designing of the power converter increases.

When the power converter of the present invention is used for a motor driving apparatus, an erroneous operation of the switching elements can be prevented, so that a reliability of the operation of the motor driving apparatus improves, and flexibility and the degree of freedom of designing of the motor driving apparatus increases.

What is claimed is:

1. A power converter for converting input DC power to AC power by a switching operation of a switching element, comprising:

a bridge circuit configured by at least two series circuits using, as power in input terminals, terminals on both sides of two switching elements connected to each other in series and using, as a power output terminal, a connection point of the two switching elements connected in parallel via the power output terminal;

a gate drive circuit having driving signal output terminals for outputting a driving signal which controls to turn on/off the switching elements by the same driving signal; and signal lines using the driving signal output terminals in the gate drive circuit as a starting point of wiring, each signal line individually hard-wired between one driving signal output terminal and a corresponding switching element, the signal lines having inductances which are substantially equal to each other, wherein the signal lines include:

gate signal lines individually hard-wiring a positive-side electrode in the driving signal output terminal and each of gate terminals of the switching elements in each of the series circuits to which the same driving signal is supplied from the driving signal output terminal; and emitter signal lines individually hard-wiring a negative-side electrode in the driving signal output terminal and emitter terminals of the switching elements in each of the series circuits to which the same driving signal is supplied from the driving signal output terminal.

2. The power converter according to claim 1, wherein inductors are provided on signal lines for transmitting the same driving signal so that inductances of the signal lines are substantially equal to each other.

3. The power converter according to claim 1, wherein the signal lines for transmitting the same driving signal have substantially equal impedances.

4. The power converter according to claim 1, wherein the signal line is formed by a cable or a wiring pattern provided on a printed board.

* * * * *